United States Patent
Byun et al.

(10) Patent No.: US 11,881,399 B2
(45) Date of Patent: *Jan. 23, 2024

(54) METHOD OF FORMING TRANSITION METAL DICHALCOGENIDE THIN FILM

(71) Applicants: Samsung Electronics Co., Ltd., Suwon-si (KR); RESEARCH & BUSINESS FOUNDATION SUNGKYUNKWAN UNIVERSITY, Gyeonggi-do (KR)

(72) Inventors: Kyung-Eun Byun, Seongnam-si (KR); Hyoungsub Kim, Seoul (KR); Taejin Park, Yongin-si (KR); Hoijoon Kim, Daejeon (KR); Hyeonjin Shin, Suwon-si (KR); Wonsik Ahn, Bucheon-si (KR); Mirine Leem, Suwon-si (KR); Yeonchoo Cho, Seongnam-si (KR)

(73) Assignees: Samsung Electronics Co., Ltd., Gyeonggi-do (KR); RESEARCH & BUSINESS FOUNDATION SUNGKYUNKWAN UNIVERSITY, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/949,418

(22) Filed: Sep. 21, 2022

(65) Prior Publication Data
US 2023/0024913 A1   Jan. 26, 2023

Related U.S. Application Data

(63) Continuation of application No. 16/928,560, filed on Jul. 14, 2020, now Pat. No. 11,476,117.

(30) Foreign Application Priority Data

Jul. 16, 2019   (KR) .................. 10-2019-0085821

(51) Int. Cl.
H01L 21/02   (2006.01)

(52) U.S. Cl.
CPC .... *H01L 21/02568* (2013.01); *H01L 21/0262* (2013.01); *H01L 21/02491* (2013.01); *H01L 21/02658* (2013.01)

(58) Field of Classification Search
None
See application file for complete search history.

(56) References Cited

U.S. PATENT DOCUMENTS

| 10,056,253 B2 | 8/2018 | Delabie et al. |
| 2015/0211112 A1 | 7/2015 | Cadot et al. |
| 2017/0073812 A1 | 3/2017 | Sundaram |
| 2017/0250075 A1 | 8/2017 | Caymax et al. |
| 2017/0267527 A1 | 9/2017 | Kim et al. |

(Continued)

FOREIGN PATENT DOCUMENTS

| KR | 20160093376 A | 8/2016 |
| KR | 101655757 B1 | 9/2016 |
| KR | 20180115659 A | 10/2018 |

OTHER PUBLICATIONS

Dragoman et al. "MoS2 radio: detecting radio waves with a two-dimensional transition metal dichalcogenide semiconductor" Nanotechnology, 2020, 31, 06LT01 (Year: 2020).*

(Continued)

*Primary Examiner* — Bo B Jang
(74) *Attorney, Agent, or Firm* — Harness, Dickey & Pierce, P.L.C.

(57) ABSTRACT

A method of forming a transition metal dichalcogenide thin film on a substrate includes treating the substrate with a metal organic material and providing a transition metal precursor and a chalcogen precursor around the substrate to synthesize transition metal dichalcogenide on the substrate. The transition metal precursor may include a transition (Continued)

metal element and the chalcogen precursor may include a chalcogen element.

19 Claims, 9 Drawing Sheets

(56) References Cited

U.S. PATENT DOCUMENTS

| | | |
|---|---|---|
| 2017/0352766 A1 | 12/2017 | Delabie et al. |
| 2018/0013020 A1 | 1/2018 | Choi et al. |
| 2018/0127873 A1 | 5/2018 | Sarnet et al. |

OTHER PUBLICATIONS

Naveen Kaushik et al., "Interfacial n?Doping Using an Ultrathin TiO2 Layer for Contact Resistance Reduction in MoS2" ACS Appl. Mater. Interfaces 2016, 8, 256-263.

Seokhee Shin et al., "High Turnover Frequency of Hydrogen Evolution Reaction on Amorphous MoS2 Thin Film Directly Grown by Atomic Layer Deposition" American Chemical Society, Langmuir 2015, 31, 1196-1202.

Christian Martella et al., "Engineering the Growth of MoS 2 via Atomic Layer Deposition of Molybdenum Oxide Film Precursor" WILEY-VCH Verlag Gmbh & Co. KGaA, Weinheim, Adv. Electron. Mater. 2016, 2, 1600330.

Dip K. Nandi et al., "Highly Uniform Atomic Layer-Deposited MoS2@3D-Ni-Foam: A Novel Approach To Prepare an Electrode for Supercapacitors" ACS Appl. Mater. Interfaces 2017, 9, 40252-40264.

Coherent, "Excimer Laser Based Solutions for Carbon Composites Cleaning " Case Study, US Pamphlet, 2017.

Yuehui Jia et al., "Toward High Carrier Mobility and Low Contact Resistance: Laser Cleaning of PMMA Residues on Graphene Surfaces" CrossMark, Nano-Micro Lett. (2016) 8(4):336-346.

Woosuk Choi et al., "Influence of removing PMMA residues on surface of CVD graphene using a contact-mode atomic force microscope" RSC Adv., 2017, 7, 6943-6949.

Menachem Genut et al., "Excimer laser photoresist stripping" SPIE'S 1996 International Symposium on Microlithography, 601-612.

Extended European Search Report dated Nov. 13, 2020, issued in corresponding European Patent Application No. 20183928.9.

\* cited by examiner

METHOD OF FORMING TRANSITION METAL DICHALCOGENIDE THIN FILM

CROSS-REFERENCE TO RELATED APPLICATION

This application is a continuation of U.S. application Ser. No. 16/928,560, filed Jul. 14, 2020, which claims the benefit of Korean Patent Application No. 10-2019-0085821, filed on Jul. 16, 2019, in the Korean Intellectual Property Office, the disclosure of each of which is incorporated herein in its entirety by reference.

BACKGROUND

1. Field

The present disclosure relates to a method of forming a transition metal dichalcogenide thin film.

2. Description of Related Art

Transition metal dichalcogenide (TMD) is a two-dimensional material having semiconductor characteristics. Transition metal dichalcogenide includes two chalcogenide atom layers, each having a two-dimensional hexagonal honeycomb structure, and one metal atom layer interposed between the chalcogenide atom layers. Transition metal dichalcogenide is a material that can be applied to various devices because it has excellent electrical properties, its characteristics do not change greatly even when its thickness decreases to the nanoscale, and it has high mobility.

SUMMARY

One or more embodiments provide a method of forming a transition metal dichalcogenide thin film.

According to an embodiment, a method of forming a transition metal dichalcogenide thin film on a substrate is provided. The method includes treating the substrate with a metal organic material and providing a transition metal precursor and a chalcogen precursor around the substrate to synthesize a transition metal dichalcogenide on the substrate. The transition metal precursor includes a transition metal element and the chalcogen precursor includes a chalcogen element.

Additional aspects will be set forth in part in the description which follows and, in part, will be apparent from the description, or may be learned by practice of the presented embodiments of the disclosure.

In some embodiments, the metal organic material may include a metal for inducing adsorption of the transition metal precursor and the chalcogen precursor.

In some embodiments, the metal organic material may include at least one of Al, Ti, and Ni. The metal organic material may include at least one of trimethylaluminum, tris(demethylamido)aluminum, triisobutylaluminum, titanium isopropoxide, tetrakis(dimethylamido)titanium, bis(cyclopentadienyl)nickel, and bis(ethylcyclopentadienyl)nickel.

In some embodiments, the transition metal dichalcogenide may be represented by Formula 1 below:

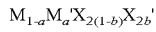   <Formula 1> wherein, in Formula 1,

M and M' may be different transition metal elements from each other,

X and X' may be different chalcogen elements from each other, $0 \leq a < 1$, and $0 \leq b < 1$.

In some embodiments, the transition metal element may include at least one of Ti, Zr, Hf, V, Nb, Ta, Mo, W, Tc, Re, Co, Rh, Ir, Ni, Pd, Pt, Zn, and Sn, and the chalcogen element may include at least one of S, Se, and Te.

In some embodiments, the transition metal precursor may include a transition metal halide.

In some embodiments, the transition metal halide may include at least one of $MoF_3$, $MoF_6$, $MoF_4$, $Mo_4F_{20}$, $MoCl_2$, $MoCl_3$, $MoCl_6$, $MoCl_4$, $MoCl_5$, $MoBr_3$, $MoBr_4$, $MoI_2$, $MoI_3$, $MoI_4$, $WF_6$, $WF_4$, $[WF_5]_4$, $WCl_2$, $WCl_6$, $WCl_4$, $[WCl_5]_2$, $[W_6Cl_{12}]Cl_6$, $WBr_3$, $WBr_6$, $WBr_4$, $WBr_5$, $W_6Br_{14}$, $WI_2$, $WI_3$, $WI_4$, $VF_2$, $VF_3$, $VF_4$, $VF_5$, $VCl_2$, $VCl_3$, $VCl_4$, $VBr_2$, $VBr_3$, $VBr_4$, $VI_2$, $VI_3$, $VI_4$, $NbCl_3$, $NbCl_4$, $NbCl_5$, $NbBr_4$, $NbBr_5$, $NbI_3$, $NbI_4$, $NbI_5$, $TaF_3$, $[TaF_5]_4$, $TaCl_3$, $TaCl_4$, $TaCl_5$, $TaBr_3$, $TaBr_4$, $TaBr_5$, $TaI_4$, $TaI_5$, $TiF_2$, $TiF_3$, $TiF_4$, $TiCl_4$, $TiCl_3$, $TiCl_2$, $TiBr_3$, $TiBr_4$, $HfCl_4$, $HfBr_2$, $HfBr_4$, $HfI_3$, $HfI_4$, $ZrF_4$, $ZrCl_2$, $ZrCl_3$, $ZrCl_4$, $ZrBr_3$, $ZrBr_4$, $ZrI_2$, $ZrI_3$, $ZrI_4$, $TcF_6$, $TcF_5$, $TcCl_4$, $TcCl_6$, $TcBr_4$, $ReF_6$, $ReF_4$, $ReF_5$, $ReF_7$, $Re_3Cl_9$, $ReCl_5$, $ReCl_4$, $ReCl_6$, $ReBr_3$, $ReBr_4$, $ReBr_5$, $ReI_3$, $ReI_4$, $CoF_2$, $CoF_3$, $CoF_4$, $CoCl_2$, $CoCl_3$, $CoBr_2$, $CoI_2$, $RhF_3$, $RhF_6$, $RhF_4$, $[RhF_5]_4$, $RhCl_3$, $RhBr_3$, $RhI_3$, $IrF_3$, $IrF_6$, $IrF_4$, $[IrF_5]_4$, $IrCl_2$, $IrCl_3$, $IrCl_4$, $IrBr_2$, $IrBr_3$, $IrBr_4$, $IrI_2$, $IrI_3$, $IrI_4$, $NiF_2$, $NiCl_2$, $NiBr_2$, $NiI_2$, $PdF_2$, $PdF_4$, $PdCl_2$, $PdBr_2$, $PdI_2$, $PtF_6$, $PtF_4$, $[PtF_5]_4$, $PtCl_2$, $PtCl_3$, $PtCl_4$, $Pt_6Cl_{12}$, $PtBr_2$, $PtBr_3$, $PtBr_4$, $PtI_2$, $PtI_3$, $PtI_4$, $GaF_3$, $GaCl_2$, $GaCl_3$, $GaBr_3$, $GaI_3$, $SnF_2$, $SnF_4$, $SnCl_2$, $SnCl_4$, $SnBr_2$, $SnBr_4$, $SnI_2$, and $SnI_4$.

In some embodiments, the chalcogen precursor may include at least one of sulfur, hydrogen sulfide ($H_2S$), diethyl sulfide, dimethyl disulfide, ethyl methyl sulfide, $(Et_3Si)_2S$, selenium vapor, hydrogen selenide ($H_2Se$), diethyl selenide, dimethyl diselenide, ethyl methyl selenide, $(Et_3Si)_2Se$, selenium vapor, tellurium vapor, hydrogen telluride ($H_2Te$), dimethyl telluride, diethyl telluride, ethyl methyl telluride, and $(Et_3Si)_2Te$.

In some embodiments, the substrate may include at least one of silicon, silicon oxide, aluminum oxide, magnesium oxide, silicon carbide, silicon nitride, glass, quartz, sapphire, graphite, graphene, polyimide copolymer, polyimide, polyethylene naphthalate (PEN), a fluoropolymer (FEP), and polyethylene terephthalate (PET).

In some embodiments, the treating the substrate with the metal organic material may include: providing the metal organic material around the substrate; and heat-treating a vicinity of the substrate to decompose the metal organic material.

In some embodiments, the heat-treating the vicinity of the substrate produces a metal by the decomposition of the metal organic material on the substrate. The heat-treating the vicinity of the substrate may be performed at 300° C. to 500° C.

In some embodiments, the providing the transition metal precursor and the chalcogen precursor around the substrates may form the transition metal dichalcogenide thin film by an atomic layer deposition (ALD) process or a chemical vapor deposition (CVD) process.

In some embodiments, the treating the substrate with the metal organic material may be performed before the providing the transition metal precursor and the chalcogen precursor around the substrate to synthesize the transition metal dichalcogenide or during the providing the transition metal precursor and the chalcogen precursor around the substrate to synthesize the transition metal dichalcogenide.

In some embodiments, the transition metal precursor and the chalcogen precursor may be provided simultaneously to the substrate or alternately provided to the substrate.

According to another embodiment, a method of forming a transition metal dichalcogenide thin film on a substrate is provided. The method includes treating the substrate with a metal organic material and synthesizing transition metal dichalcogenide on the substrate using an atomic layer deposition (ALD) process.

In some embodiments, the forming the transition metal dichalcogenide thin film may be performed at 300° C. to 500° C.

According to another embodiment, a method of forming a transition metal dichalcogenide thin film on a substrate is provided. The method includes treating the substrate with a metal organic material and synthesizing a transition metal dichalcogenide on the substrate using a chemical vapor deposition (CVD) process.

In some embodiments, the forming the transition metal dichalcogenide thin film may be performed at 300° C. to 500° C.

According to another embodiment, a method of forming a transition metal dichalcogenide thin film on a substrate is provided. The method may include treating a substrate to provide a metal on a surface of the substrate and depositing a transition metal dichalcogenide layer on the surface of the substrate. The metal may include at least one of Al, Ti, and Ni. The treating the substrate and the depositing the transition metal dichalcogenide may be performed at process chamber temperatures in a range of 300° C. to 500° C.

In some embodiments, the depositing the transition metal dichalcogenide layer may be an atomic layer deposition (ALD) process or a chemical vapor deposition (CVD) process.

In some embodiments, the substrate may include at least one of silicon, silicon oxide, aluminum oxide, magnesium oxide, silicon carbide, silicon nitride, glass, quartz, sapphire, graphite, graphene, polyimide copolymer, polyimide, polyethylene naphthalate (PEN), a fluoropolymer (FEP), and polyethylene terephthalate (PET).

In some embodiments, the treating the substrate may be performed before the depositing the transition metal dichalcogenide layer.

In some embodiments, the treating the substrate is performed during the depositing the transition metal dichalcogenide layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
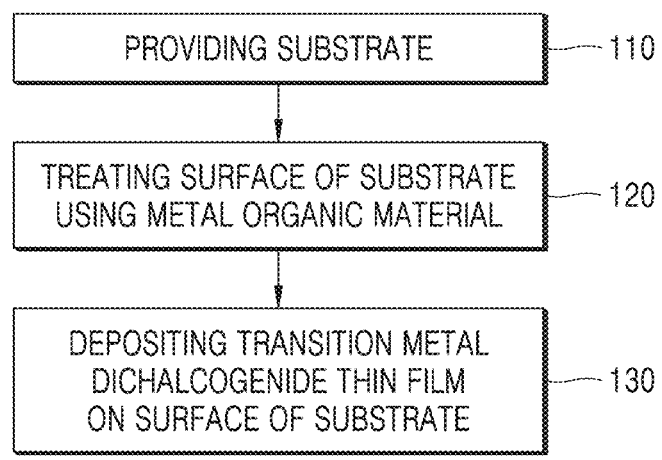
FIG. 1 is a flowchart illustrating a method of forming a transition metal dichalcogenide thin film, according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items.

Expressions such as "at least one of," when preceding a list of elements, modify the entire list of elements and do not modify the individual elements of the list.

Hereinafter, when a layer, film, region, plate, or the like is referred to as being "on" or "on" another portion throughout the specification, this includes not only the case directly above another portion but also the case where there is another portion in between. As used herein, the singular forms "a," "an" and "the" are intended to include the plural forms as well, unless the context clearly indicates otherwise. the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

The use of the term "the above" and similar terminology may be used in the singular forms and the plural forms. If steps constituting the method are not explicitly stated or contrary to the steps, the steps may be performed in a suitable order. It is not necessarily limited to the order of description of the above steps. The use of all examples or exemplary terms is merely for the purpose of describing technical concepts in detail and is not limited in scope by the examples or exemplary terms unless defined by the claims.

Transition metal dichalcogenide (TMD) includes two chalcogenide atom layers each having a two-dimensional hexagonal honeycomb structure, and one metal atom layer interposed between the chalcogenide atom layers. The transition metal dichalcogenide may be represented by Formula 1 below.

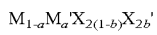   <Formula 1>

Here, M and M' are different transition metal elements from each other, X and X' are different chalcogen elements from each other, and $0 \leq a < 1$ and $0 \leq b < 1$ are satisfied.

The transition metal element may include at least one (and/or at least two) selected from Ti, Zr, Hf, V, Nb, Ta, Mo, W, Tc, Re, Co, Rh, Ir, Ni, Pd, Pt, Zn, and Sn. Further, the chalcogen element may include at least one (and/or at least two) selected from S, Se, and Te. However, inventive concepts are not limited thereto.

In the following embodiments, methods of forming a transition metal dichalcogenide thin film on a substrate will be described.

FIG. 1 is a flowchart illustrating a method of forming a transition metal dichalcogenide thin film, according to an example embodiment.

Referring to FIG. 1, first, a substrate, on which a transition metal dichalcogenide thin film is to be formed, is prepared (110). Here, the substrate may include various materials. For example, the substrate may include a metal, a semiconductor, a dielectric, or a combination thereof (e.g., semiconductor on dielectric).

Illustratively, the substrate may include at least one selected from silicon, silicon oxide, aluminum oxide, magnesium oxide, silicon carbide, silicon nitride, glass, quartz, sapphire, graphite, graphene, polyimide copolymer, polyimide, polyethylene naphthalate (PEN), a fluoropolymer (FEP), and polyethylene terephthalate (PET). However, the material of the substrate is not limited thereto.

Next, the surface of the substrate is treated using a metal organic material (120). Here, the process of treating the surface of the substrate includes: providing the metal organic material around the substrate; and heat-treating the vicinity of the substrate. Here, the heat-treating of the vicinity of the substrate may be performed at about 500° C. or lower (for example, 300° C. to 500° C.).

Like this, when the metal organic material is provided around the substrate and the heat-treating of the vicinity of the substrate is performed at 500° C. or lower, the metal organic material is decomposed to produce a metal, and this metal is formed on the surface of the substrate. The metal formed on the surface of the substrate in this way may serve as a catalyst in the process of synthesizing transition metal dichalcogenide to be described later.

The metal organic material may include at least one selected from Al, Ti, and Ni. In this case, for example, the metal organic material may include at least one selected from trimethylaluminum, tris(demethylamido)aluminum, triisobutylaluminum, titanium isopropoxide, tetrakis(dimethylamido)titanium, bis(cyclopentadienyl)nickel, and bis(ethylcyclopentadienyl)nickel. However, inventive concepts are not limited thereto.

Subsequently, transition metal dichalcogenide is synthesized on the surface of the substrate, and a transition metal dichalcogenide thin film is deposited (130). This thin film deposition process may be performed at a temperature of about 500° C. (for example, 300° C. to 500° C.).

The synthesis of the transition metal dichalcogenide may be performed on the surface of the substrate by providing a transition metal precursor including a transition metal element and a chalcogen precursor including a chalcogen element around the substrate. Here, the transition metal precursor and the chalcogen precursor may be provided simultaneously or alternately to the substrate.

The transition metal precursor may include, for example, a transition metal halide. Here, for example, the transition metal halide includes at least one selected from $MoF_3$, $MoF_6$, $MoF_4$, $Mo_4F_{20}$, $MoCl_2$, $MoCl_3$, $MoCl_6$, $MoCl_4$, $MoCl_5$, $MoBr_3$, $MoBr_4$, $MoI_2$, $MoI_3$, $MoI_4$, $WF_6$, $WF_4$, $[WF_5]_4$, $WCl_2$, $WCl_6$, $WCl_4$, $[WCl_5]_2$, $[W_6Cl_{12}]Cl_6$, $WBr_3$, $WBr_6$, $WBr_4$, $WBr_5$, $W_6Br_{14}$, $WI_2$, $WI_3$, $WI_4$, $VF_2$, $VF_3$, $VF_4$, $VF_5$, $VCl_2$, $VCl_3$, $VCl_4$, $VBr_2$, $VBr_3$, $VBr_4$, $VI_2$, $VI_3$, $VI_4$, $NbCl_3$, $NbCl_4$, $NbCl_5$, $NbBr_4$, $NbBr_5$, $NbI_3$, $NbI_4$, $NbI_5$, $TaF_3$, $[TaF_5]_4$, $TaCl_3$, $TaCl_4$, $TaCl_5$, $TaBr_3$, $TaBr_4$, $TaBr_5$, $TaI_4$, $TaI_5$, $TiF_2$, $TiF_3$, $TiF_4$, $TiCl_4$, $TiCl_3$, $TiCl_2$, $TiBr_3$, $TiBr_4$, $HfCl_4$, $HfBr_2$, $HfBr_4$, $HfI_3$, $HfI_4$, $ZrF_4$, $ZrCl_2$, $ZrCl_3$, $ZrCl_4$, $ZrBr_3$, $ZrBr_4$, $ZrI_2$, $ZrI_3$, $ZrI_4$, $TcF_6$, $TcF_5$, $TcCl_4$, $TcCl_6$, $TcBr_4$, $ReF_6$, $ReF_4$, $ReF_5$, $ReF_7$, $Re_3Cl_9$, $ReCl_5$, $ReCl_4$, $ReCl_6$, $ReBr_3$, $ReBr_4$, $ReBr_5$, $ReI_3$, $ReI_4$, $CoF_2$, $CoF_3$, $CoF_4$, $CoCl_2$, $CoCl_3$, $CoBr_2$, $CoI_2$, $RhF_3$, $RhF_6$, $RhF_4$, $[RhF_5]_4$, $RhCl_3$, $RhBr_3$, $RhI_3$, $IrF_3$, $IrF_6$, $IrF_4$, $[IrF_5]_4$, $IrCl_2$, $IrCl_3$, $IrCl_4$, $IrBr_2$, $IrBr_3$, $IrBr_4$, $IrI_2$, $IrI_3$, $IrI_4$, $NiF_2$, $NiCl_2$, $NiBr_2$, $NiI_2$, $PdF_2$, $PdF_4$, $PdCl_2$, $PdBr_2$, $PdI_2$, $PtF_6$, $PtF_4$, $[PtF_5]_4$, $PtCl_2$, $PtCl_3$, $PtCl_4$, $Pt_6Cl_{12}$, $PtBr_2$, $PtBr_3$, $PtBr_4$, $PtI_2$, $PtI_3$, $PtI_4$, $GaF_3$, $GaCl_2$, $GaCl_3$, $GaBr_3$, $GaI_3$, $SnF_2$, $SnF_4$, $SnCl_2$, $SnCl_4$, $SnBr_2$, $SnBr_4$, $SnI_2$, and $SnI_4$. However, inventive concepts are not limited thereto.

The chalcogen precursor includes at least one selected from sulfur, hydrogen sulfide ($H_2S$), diethyl sulfide, dimethyl disulfide, ethyl methyl sulfide, $(Et_3Si)_2S$, selenium vapor, hydrogen selenide ($H_2Se$), diethyl selenide, dimethyl diselenide, ethyl methyl selenide, $(Et_3Si)_2Se$, selenium vapor, tellurium vapor, hydrogen telluride ($H_2Te$), dimethyl telluride, diethyl telluride, ethyl methyl telluride, and $(Et_3Si)_2Te$. However, inventive concepts are not limited thereto.

The metal organic material is decomposed by the surface treatment of the substrate to form a metal on the surface of the substrate, and this metal induces the adsorption of the transition metal precursor and the chalcogen precursor on the substrate, thereby effectively synthesizing the transition metal chalcogenide on the surface of the substrate.

Heretofore, there have been described a case where the surface treatment of the substrate using the metal organic material is performed before synthesizing the transition metal dichalcogenide. However, inventive concepts are not limited thereto, and the surface treatment of the substrate using the metal organic material may also be performed while synthesizing the transition metal dichalcogenide.

The surface treatment of the substrate and the synthesis of the transition metal dichalcogenide may be performed by an atomic layer deposition (ALD) process or a chemical vapor deposition (CVD) process. However, inventive concepts are not limited thereto.

In general, the transition metal dichalcogenide is synthesized at high temperatures of 600° C. or higher to form a thin film. Meanwhile, there is a method of forming a thin film by synthesizing the transition metal dichalcogenide at low temperature of 600° C. or lower. However, in this case, in order to improve the quality of the thin film, the heat treatment is required to be performed at high temperatures of 600° C. or higher. Further, in order to lower activation energy for synthesizing the transition metal dichalcogenide, a method of forming a catalyst metal layer on a substrate or a method of treating the surface of a substrate using $H_2S$ has been used. However, the method of forming a catalyst metal layer on a substrate has a problem that a metal is additionally deposited on the substrate through a separate process in order to form the catalyst metal layer, and the method of treating the surface of a substrate using $H_2S$ has a problem that there is a substrate (for example, a silicon substrate) that is difficult to treat by $H_2S$.

According to the present embodiment, the surface of the substrate may be treated using the metal organic material at a relatively low temperature of about 500° C. or lower, thereby effectively forming a high-quality transition metal dichalcogenide thin film on the surface of the substrate through one process (for example, an ALD process or a CVID process).

Figure 2:
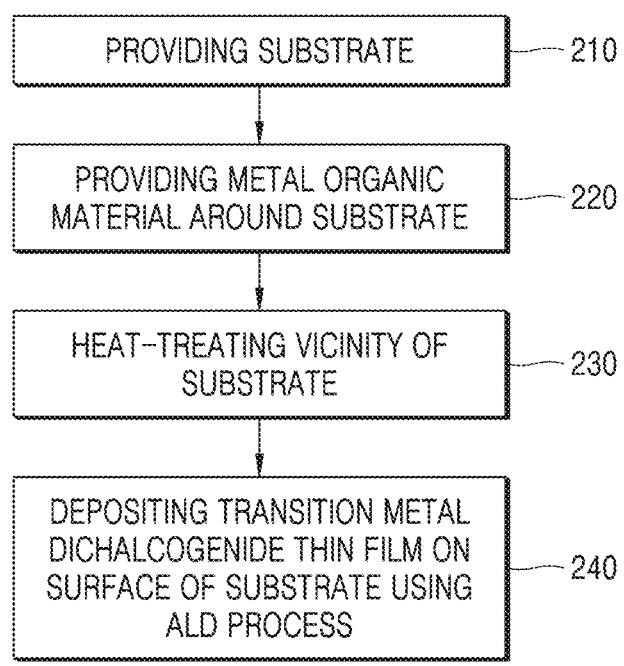
FIG. 2 is a flowchart illustrating a method of forming a transition metal dichalcogenide thin film, according to another example embodiment.

FIG. 2 is a flowchart illustrating a method of forming a transition metal dichalcogenide thin film, according to another example embodiment. FIG. 2 illustrates a method of forming a transition metal dichalcogenide thin film using an ALD process.

Referring to FIG. 2, first, a substrate is provided 210 in a process chamber that performs an ALD process (210). The substrate may, for example, include a metal, a semiconductor, a dielectric, or a combination thereof (e.g., semiconductor on dielectric). As described above, the substrate may include at least one selected from silicon, silicon oxide, aluminum oxide, magnesium oxide, silicon carbide, silicon nitride, glass, quartz, sapphire, graphite, graphene, polyimide copolymer, polyimide, polyethylene naphthalate (PEN), a fluoropolymer (FEP), and polyethylene terephthalate (PET). However, inventive concepts are not limited thereto.

Next, the surface of the substrate is treated using a metal organic material. Here, the metal organic material may include a metal for inducing the adsorption of a transition metal precursor and a chalcogen precursor to be described later.

The metal organic material may include at least one selected from Al, Ti, and Ni. Specifically, for example, the metal organic material may include at least one selected from trimethylaluminum, tris(demethylamido)aluminum, triisobutylaluminum, titanium isopropoxide, tetrakis(dimethylamido)titanium, bis(cyclopentadienyl)nickel, and bis(ethylcyclopentadienyl)nickel. However, inventive concepts are not limited thereto.

The process of treating the surface of the substrate includes: providing the metal organic material around the substrate (220); and heat-treating the vicinity of the substrate (230). Here, the heat-treating of the vicinity of the substrate may be performed at about 500° C. or lower (for example, 300° C. to 500° C.).

In the ALD process, the process of treating the surface of the substrate using the metal organic material may be performed by repeatedly providing the metal organic material around the substrate at a desired and/or alternatively predetermined heat treatment temperature in a plurality of cycles.

Specifically, first, the temperature in the process chamber is maintained at a heat treatment temperature of 500° C. or lower (for example, 300° C. to 500° C.) in a state in which the metal organic material is supplied into the process chamber to provide the metal organic material around the substrate. Accordingly, the metal organic material supplied into the process chamber is decomposed to produce a metal, and the metal produced in this way is formed on the surface of the substrate. The metal formed on the surface of the substrate may serve as a catalyst in the process of synthesizing transition metal dichalcogenide to be described later. That is, the metal formed on the surface of the substrate may induce the adsorption of the transition metal precursor and the chalcogen precursor. The metal organic material remaining in the process chamber after forming the metal on the substrate is discharged to the outside. Subsequently, a desired amount of metal may be formed on the surface of the substrate by repeatedly performing the aforementioned supply and discharge processes of the metal organic material in a plurality of cycles.

After the metal is formed on the surface of the substrate, transition metal dichalcogenide is synthesized on the surface of the substrate using a general ALD process, thereby depositing a transition metal dichalcogenide thin film (240). Such a thin film deposition process may be performed at a temperature of 500° C. or lower (for example, 300° C. to 500° C.).

Specifically, first, a transition metal precursor including a transition metal element is supplied into a process chamber. Here, the transition metal element may include at least one selected from Ti, Zr, Hf, V, Nb, Ta, Mo, W, Tc, Re, Co, Rh, Ir, N, Pd, Pt, Zn, and Sn. However, inventive concepts are not limited thereto.

The transition metal precursor may include a transition metal halide. As describe above, the transition metal halide may include at least one selected from $MoF_3$, $MoF_6$, $MoF_4$, $Mo_4F_{20}$, $MoCl_2$, $MoCl_3$, $MoCl_6$, $MoCl_4$, $MoCl_5$, $MoBr_3$, $MoBr_4$, $MoI_2$, $MoI_3$, $MoI_4$, $WF_6$, $WF_4$, $[WF_5]_4$, $WCl_2$, $WCl_6$, $WCl_4$, $[WCl_5]_2$, $[W_6Cl_{12}]Cl_6$, $WBr_3$, $WBr_6$, $WBr_4$, $WBr_5$, $W_6Br_{14}$, $WI_2$, $WI_3$, $WI_4$, $VF_2$, $VF_3$, $VF_4$, $VF_5$, $VCl_2$, $VCl_3$, $VCl_4$, $VBr_2$, $VBr_3$, $VBr_4$, $VI_2$, $VI_3$, $VI_4$, $NbCl_3$, $NbCl_4$, $NbCl_5$, $NbBr_4$, $NbBr_5$, $NbI_3$, $NbI_4$, $NbI_5$, $TaF_3$, $[TaF_5]_4$, $TaCl_3$, $TaCl_4$, $TaCl_5$, $TaBr_3$, $TaBr_4$, $TaBr_5$, $TaI_4$, $TaI_5$, $TiF_2$, $TiF_3$, $TiF_4$, $TiCl_4$, $TiCl_3$, $TiCl_2$, $TiBr_3$, $TiBr_4$, $HfCl_4$, $HfBr_2$, $HfBr_4$, $HfI_3$, $HfI_4$, $ZrF_4$, $ZrCl_2$, $ZrCl_3$, $ZrCl_4$, $ZrBr_3$, $ZrBr_4$, $ZrI_2$, $ZrI_3$, $ZrI_4$, $TcF_6$, $TcF_5$, $TcCl_4$, $TcCl_6$, $TcBr_4$, $ReF_6$, $ReF_4$, $ReF_5$, $ReF_7$, $Re_3Cl_9$, $ReCl_5$, $ReCl_4$, $ReCl_6$, $ReBr_3$, $ReBr_4$, $ReBr_5$, $ReI_3$, $ReI_4$, $CoF_2$, $CoF_3$, $CoF_4$, $CoCl_2$, $CoCl_3$, $CoBr_2$, $CoI_2$, $RhF_3$, $RhF_6$, $RhF_4$, $[RhF_5]_4$, $RhCl_3$, $RhBr_3$, $RhI_3$, $IrF_3$, $IrF_6$, $IrF_4$, $[IrF_5]_4$, $IrCl_2$, $IrCl_3$, $IrCl_4$, $IrBr_2$, $IrBr_3$, $IrBr_4$, $IrI_2$, $IrI_3$, $IrI_4$, $NiF_2$, $NiCl_2$, $NiBr_2$, $NiI_2$, $PdF_2$, $PdF_4$, $PdCl_2$, $PdBr_2$, $PdI_2$, $PtF_6$, $PtF_4$, $[PtF_5]_4$, $PtCl_2$, $PtCl_3$, $PtCl_4$, $Pt_6Cl_{12}$, $PtBr_2$, $PtBr_3$, $PtBr_4$, $PtI_2$, $PtI_3$, $PtI_4$, $GaF_3$, $GaCl_2$, $GaCl_3$, $GaBr_3$, $GaI_3$, $SnF_2$, $SnF_4$, $SnCl_2$, $SnCl_4$, $SnBr_2$, $SnBr_4$, $SnI_2$, and $SnI_4$.

Next, a chalcogen precursor including a chalcogen element is supplied into the process chamber. Here, the chalcogen element may include at least one selected from S, Se, and Te. However, inventive concepts are not limited thereto.

As described above, the chalcogen precursor may include at least one selected from sulfur, hydrogen sulfide ($H_2S$), diethyl sulfide, dimethyl disulfide, ethyl methyl sulfide, $(Et_3Si)_2S$, selenium vapor, hydrogen selenide ($H_2Se$), diethyl selenide, dimethyl diselenide, ethyl methyl selenide, $(Et_3Si)_2Se$, selenium vapor, tellurium vapor, hydrogen telluride ($H_2Te$), dimethyl telluride, diethyl telluride, ethyl methyl telluride, and $(Et_3Si)_2Te$.

When the temperature in the process chamber is maintained at a temperature of about 500° C. or lower, for example, 300° C. to 500° C., the transition metal precursor reacts with the chalcogen precursor on the surface of the substrate to synthesize the transition metal dichalcogenide.

As described above, since the metal is formed on the surface of the substrate using the metal organic material through the heat treatment process, the transition metal precursor and the chalcogen precursor may be effectively adsorbed on the surface of the substrate, and thus the transition metal dichalcogenide may be easily synthesized. Then, the transition metal precursor and the chalcogen precursor remaining in the process chamber are discharged to the outside. Subsequently, a transition metal dichalcogenide thin film having a desired thickness is deposited on the surface of the substrate by repeatedly performing the aforementioned supply and discharge processes of the transition metal precursor and the chalcogen precursor in a plurality of cycles.

As described above, according to the present embodiment, the surface of the substrate is treated at a temperature of about 500° C. or lower using the metal organic material through the ALD process, and then the transition metal dichalcogenide is synthesized on the surface of the substrate, thereby effectively forming a high-quality transition metal dichalcogenide thin film on the surface of the substrate.

Heretofore, there have been described a case where the surface treatment of the substrate using the metal organic material is performed before synthesizing the transition metal dichalcogenide through the ALD process. However, inventive concepts are not limited thereto, and the surface treatment of the substrate using the metal organic material may also be performed while synthesizing the transition metal dichalcogenide through the ALD process.

Figure 3A:
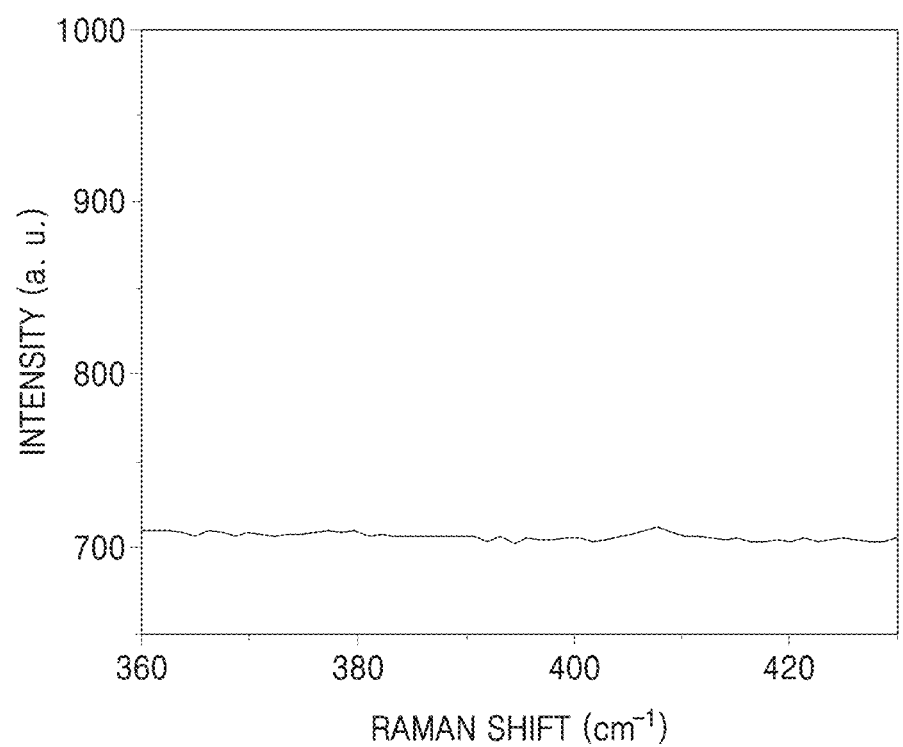
FIGS. 3A and 3B are a Raman spectrum and a PL spectrum illustrating a case where an MoS$_2$ thin film is deposited on an SiO$_2$ substrate using an ALD process without surface-treating the SiO$_2$ substrate using trimethylaluminum (TMA)
Figure 3B:
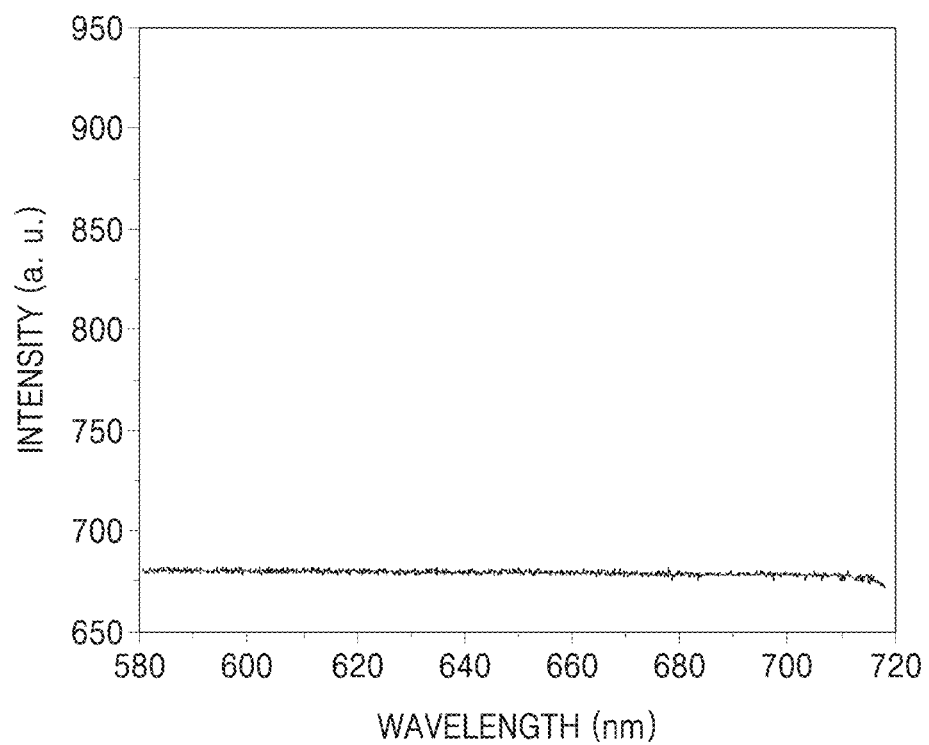

FIGS. 3A and 3B are a Raman spectrum and a PL spectrum illustrating a case where an $MoS_2$ thin film is deposited on an $SiO_2$ substrate using an ALD process without surface-treating the $SiO_2$ substrate using trimethylaluminum (TMA).

In FIGS. 3A and 3B, in the deposition process of a $MoS_2$ thin film, $MoCl_5$ was used as a transition metal precursor, and $H_2S$ was used as a chalcogen precursor. Further, a chamber coated with $SiO_2$ was used as a deposition apparatus, and a canister for supplying a $MoCl_5$ precursor was maintained at a temperature of 160° C. Further, the supply time and purging time of $MoCl_5$ at 420° C. was 2 seconds and 10 seconds as 1 cycle, respectively, and the supply time and purging time of $H_2S$ at 420° C. was 20 seconds and 10 seconds as 1 cycle, respectively. The supply and purging of $MoCl_5$ and the supply and purging of $H_2S$ were performed for total 400 cycles, respectively.

Referring to FIGS. 3A and 3B, it may be found that almost no transition metal chalcogenide thin film was formed on the surface of a $SiO_2$ substrate when the surface of the $SiO_2$ substrate was not treated using trimethylaluminum (TMA).

Figure 4A:
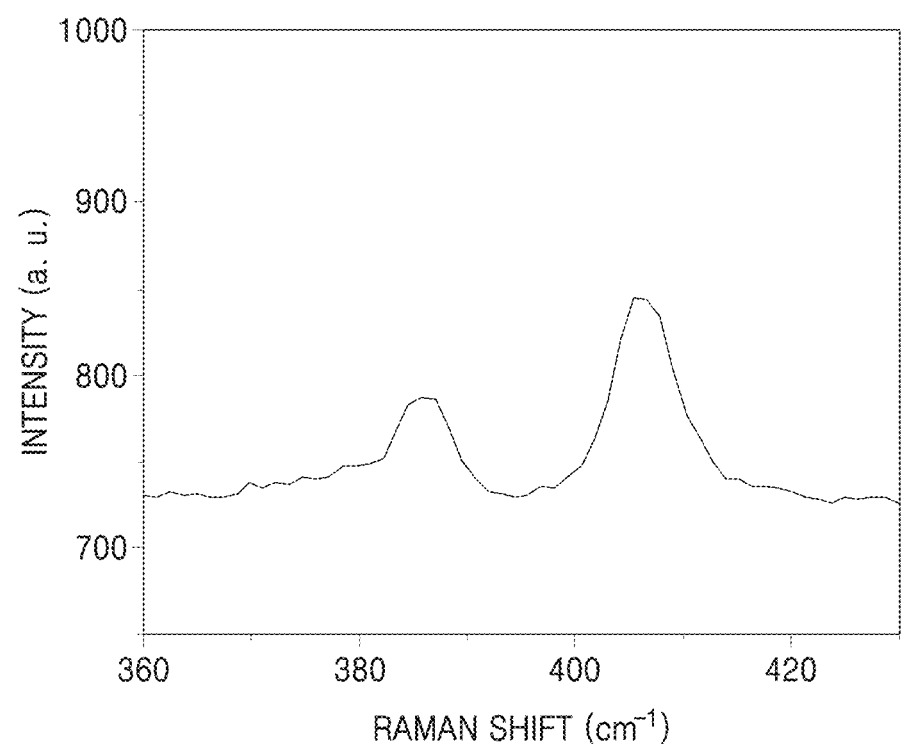
FIGS. 4A and 4B are a Raman spectrum and a PL spectrum illustrating a case where an MoS$_2$ thin film was deposited after surface-treating a SiO$_2$ substrate for 20 cycles using trimethylaluminum (TMA) through an ALD process.
Figure 4B:
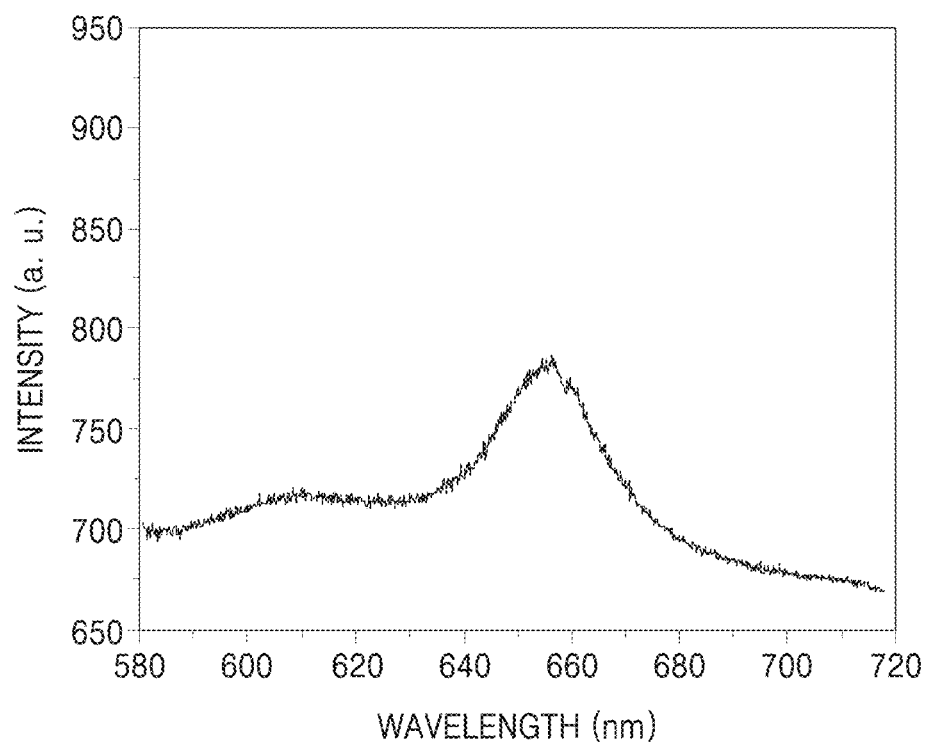

FIGS. 4A and 4B are a Raman spectrum and a PL spectrum illustrating a case where an $MoS_2$ thin film was deposited after surface-treating a $SiO_2$ substrate for 20 cycles using trimethylaluminum (TMA) through an ALD process.

Referring to FIGS. 4A and 4B, in the surface treatment process using TMA, the supply time and purging time of TMA at 420° C. was 1 second and 20 seconds as 1 cycle, respectively. The supply and purging of TMA were performed for total 20 cycles. In the deposition process of a $MoS_2$ thin film, $MoCl_5$ was used as a transition metal precursor and $H_2S$ was used as a chalcogen precursor. Further, a chamber coated with $SiO_2$ was used as a deposition apparatus, and a canister for supplying a $MoCl_5$ precursor was maintained at a temperature of 160° C. Further, the supply time and purging time of $MoCl_5$ at 420° C. was 2 seconds and 10 seconds as 1 cycle, respectively, and the supply time and purging time of $H_2S$ at 420° C. was 20 seconds and 10 seconds as 1 cycle, respectively. The supply and purging of $MoCl_5$ and the supply and purging of $H_2S$ were performed for total 400 cycles, respectively.

Referring to FIGS. 4A and 4B, it may be found that a transition metal chalcogenide thin film having monolayer characteristics was formed on the surface of a $SiO_2$ substrate when the surface of the $SiO_2$ substrate was treated using TMA for 20 cycles.

Figure 5A:
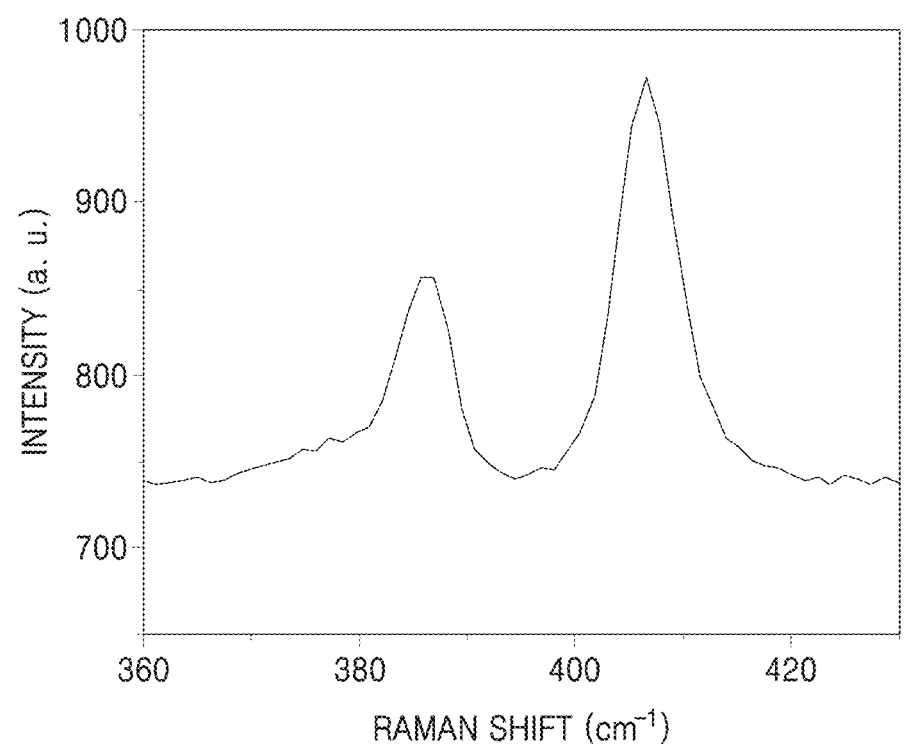
FIGS. 5A and 5B are a Raman spectrum and a PL spectrum illustrating a case where an MoS$_2$ thin film was deposited through an ALD process after surface-treating a SiO$_2$ substrate for 50 cycles using trimethylaluminum (TMA) through the ALD process.
Figure 5B:
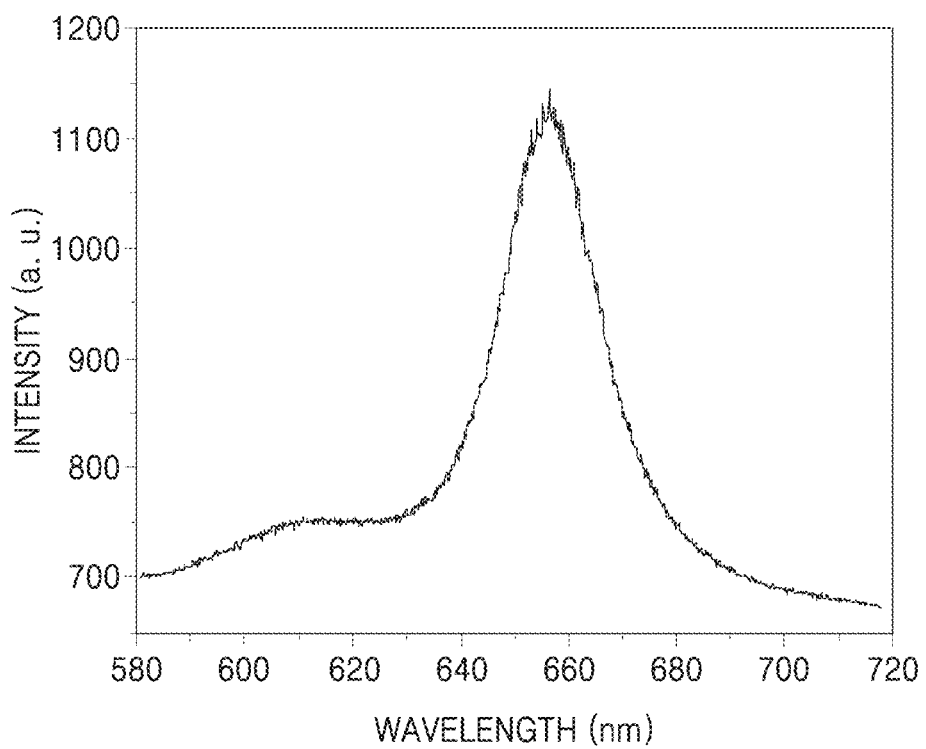

FIGS. 5A and 5B are a Raman spectrum and a PL spectrum illustrating a case where a $MoS_2$ thin film was deposited through an ALD process after surface-treating a $SiO_2$ substrate for 50 cycles using trimethylaluminum (TMA) through the ALD process.

Referring to FIGS. 5A and 5B, in the surface treatment process using TMA, the supply time and purging time of TMA at 420° C. was 1 second and 20 seconds as 1 cycle, respectively. The supply and purging of TMA were performed for total 50 cycles. In the deposition process of a $MoS_2$ thin film, $MoCl_5$ was used as a transition metal precursor, and $H_2S$ was used as a chalcogen precursor. Further, a chamber coated with $SiO_2$ was used as a deposition apparatus, and a canister for supplying a $MoCl_5$ precursor was maintained at a temperature of 160° C. Further, the supply time and purging time of $MoCl_5$ at 420° C. was 2 seconds and 10 seconds as 1 cycle, respectively, and the supply time and purging time of $H_2S$ at 420° C. was 20 seconds and 10 seconds as 1 cycle, respectively. The supply and purging of $MoCl_5$ and the supply and purging of $H_2S$ were performed for total 400 cycles, respectively.

Referring to FIGS. 5A and 5B, it may be found that a transition metal chalcogenide thin film having monolayer characteristics was formed on the surface of a $SiO_2$ substrate when the surface of the $SiO_2$ substrate was treated using TMA for 50 cycles. Further, it may found that, when the surface treatment using TMA was performed for 50 cycles, a high-quality transition metal dichalcogenide thin film was formed compared to when the surface treatment using TMA was performed for 20 cycles.

Figure 6:
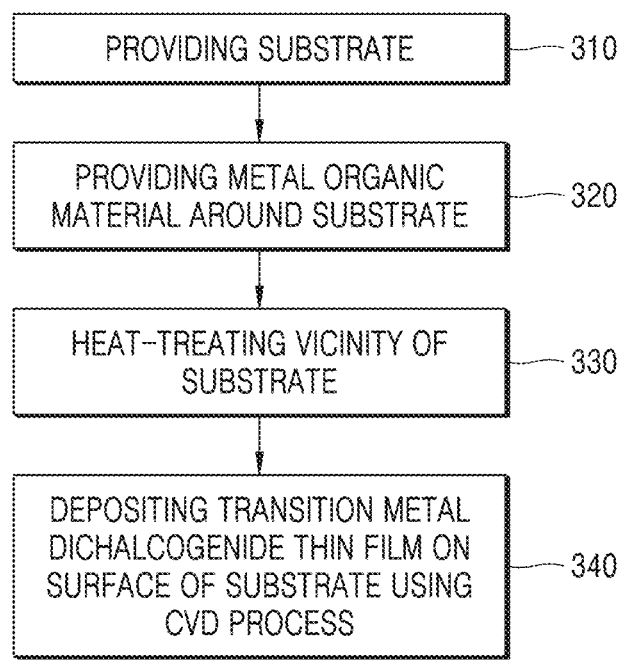
FIG. 6 is a flowchart illustrating a method of forming a transition metal dichalcogenide thin film, according to another example embodiment.

FIG. 6 is a flowchart illustrating a method of forming a transition metal dichalcogenide thin film, according to another example embodiment. FIG. 6 illustrates a method of forming a transition metal dichalcogenide thin film using a CVD process.

Referring to FIG. 6, first, a substrate is provided 310 in a process chamber that performs an ALD process (310). The substrate may, for example, include a metal, a semiconductor, a dielectric, or a combination thereof (e.g., semiconductor on dielectric).

Next, the surface of the substrate is treated using a metal organic material. Here, the metal organic material may include a metal for inducing the adsorption of a transition metal precursor and a chalcogen precursor to be described later.

The metal organic material may include at least one selected from Al, Ti, and Ni. Specifically, for example, the metal organic material may include at least one selected from trimethylaluminum, tris(demethylamido)aluminum, triisobutylaluminum, titanium isopropoxide, tetrakis(dimethylamido)titanium, bis(cyclopentadienyl)nickel, and bis(ethylcyclopentadienyl)nickel. However, inventive concepts are not limited thereto.

The process of treating the surface of the substrate includes: providing the metal organic material around the substrate (320); and heat-treating the vicinity of the substrate (330). Here, the heat-treating of the vicinity of the substrate may be performed at about 500° C. or lower (for example, 300° C. to 500° C.).

Specifically, the temperature in the process chamber is maintained at a heat treatment temperature of 500° C. or lower (for example, 300° C. to 500° C.) in a state in which the metal organic material is supplied into the process chamber to provide the metal organic material around the substrate. Accordingly, the metal organic material supplied into the process chamber is decomposed to produce a metal, and the metal produced in this way is formed on the surface of the substrate. Here, the metal formed on the surface of the substrate may induce the adsorption of the transition metal precursor and the chalcogen precursor. The metal organic material remaining in the process chamber after forming the metal on the substrate is discharged to the outside.

After the metal is formed on the surface of the substrate, transition metal dichalcogenide is synthesized on the surface of the substrate using a general CVD process, thereby depositing a transition metal dichalcogenide thin film (340). Such a thin film deposition process may be performed at a temperature of 500° C. or lower (for example, 300° C. to 500° C.).

Specifically, a transition metal precursor including a transition metal element is supplied into a process chamber. Here, the transition metal element may include at least one selected from Ti, Zr, Hf, V, Nb, Ta, Mo, W, Tc, Re, Co, Rh, Ir, N, Pd, Pt, Zn, and Sn. The transition metal precursor may include a transition metal halide. The chalcogen element may include at least one selected from S, Se, and Te. However, inventive concepts are not limited thereto.

When the temperature in the process chamber is maintained at a temperature of about 500° C. or lower, for example, 300° C. C to 500° C. C, the transition metal precursor reacts with the chalcogen precursor on the surface of the substrate to synthesize the transition metal dichalcogenide.

As described above, since the metal is formed on the surface of the substrate using the metal organic material through the heat treatment process, the transition metal precursor and the chalcogen precursor may be effectively adsorbed on the surface of the substrate, and thus the transition metal dichalcogenide may be easily synthesized. Accordingly, a transition metal dichalcogenide thin film having a desired thickness may be deposed on the surface of the substrate As described above, according to the present embodiment, the surface of the substrate is treated at a temperature of about 500° C. using the metal organic material through the CVD process, and then the transition metal dichalcogenide is synthesized on the surface of the substrate, thereby effectively forming a high-quality transition metal dichalcogenide thin film on the surface of the substrate.

Heretofore, there have been described a case where the surface treatment of the substrate using the metal organic material is performed before synthesizing the transition metal dichalcogenide through the CVD process. However, inventive concepts are not limited thereto, and the surface treatment of the substrate using the metal organic material may also be performed while synthesizing the transition metal dichalcogenide through an ALD process.

According to the aforementioned embodiment, the surface of the substrate may be treated using the metal organic material at a relatively low temperature of about 500° C. or lower, thereby effectively forming a high-quality transition metal dichalcogenide thin film on the surface of the substrate through one process (for example, an ALD process or a CVD process.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of forming a transition metal dichalcogenide thin film on a substrate, the method comprising:
   treating the substrate with a metal organic material, the metal organic material including a metal; and
   providing a transition metal precursor and a chalcogen precursor around the substrate to synthesize a transition metal dichalcogenide on the substrate, the transition metal precursor including a transition metal element and the chalcogen precursor including a chalcogen element, wherein
   the treating the substrate provides the metal on a surface of the substrate,
   the treating the substrate is performed without using $H_2S$ and includes heat-treating a vicinity of the substrate at a process temperature of 300° C. to 500° C. to decompose the metal organic material.

2. The method of claim 1, wherein
the metal on the surface of the substrate induces adsorption of the transition metal precursor and the chalcogen precursor onto the substrate.

3. The method of claim 1, wherein
the metal of metal organic material includes at least one of Al, Ti, and Ni.

4. The method of claim 3, wherein
the metal organic material includes at least one of trimethylaluminum, tris(demethylamido)aluminum, triisobutylaluminum, titanium isopropoxide, tetrakis(dimethylamido)titanium, bis(cyclopentadienyl)nickel, and bis(ethylcyclopentadienyl)nickel.

5. The method of claim 1, wherein
the transition metal dichalcogenide is represented by Formula 1 below:

$$M_{1-a}M'_a X_{2(1-b)}X'_{2b}$$ <Formula 1> wherein, in Formula 1,
M and M' are different transition metal elements from each other,
X and X' are different chalcogen elements from each other,
$0 \leq a < 1$, and $0 \leq b < 1$.

6. The method of claim 1, wherein
the transition metal element includes at least one of Ti, Zr, Hf, V, Nb, Ta, Mo, W, Tc, Re, Co, Rh, Ir, Ni, Pd, Pt, Zn, and Sn, and
the chalcogen element includes at least one of S, Se, and Te.

7. The method of claim 1, wherein
the transition metal precursor includes a transition metal halide.

8. The method of claim 7, wherein
the transition metal halide includes at least one of $MoF_3$, $MoF_6$, $MoF_4$, $Mo_4F_{20}$, $MoCl_2$, $MoCl_3$, $MoCl_6$, $MoCl_4$, $MoCl_5$, $MoBr_3$, $MoBr_4$, $MoI_2$, $MoI_3$, $MoI_4$, $WF_6$, $WF_4$, $[WF_5]_4$, $WCl_2$, $WCl_6$, $WCl_4$, $[WCl_5]_2$, $[W_6Cl_{12}]Cl_6$, $WBr_3$, $WBr_6$, $WBr_4$, $WBr_5$, $W_6Br_{14}$, $WI_2$, $WI_3$, $WI_4$, $VF_2$, $VF_3$, $VF_4$, $VF_5$, $VCl_2$, $VCl_3$, $VCl_4$, $VBr_2$, $VBr_3$, $VBr_4$, $VI_2$, $VI_3$, $VI_4$, $NbCl_3$, $NbCl_4$, $NbCl_5$, $NbBr_4$, $NbBr_5$, $NbI_3$, $NbI_4$, $NbI_5$, $TaF_3$, $[TaF_5]_4$, $TaCl_3$, $TaCl_4$, $TaCl_5$, $TaBr_3$, $TaBr_4$, $TaBr_5$, $TaI_4$, $TaI_5$, $TiF_2$, $TiF_3$, $TiF_4$, $TiCl_4$, $TiCl_3$, $TiCl_2$, $TiBr_3$, $TiBr_4$, $HfCl_4$, $HfBr_2$, $HfBr_4$, $HfI_3$, $HfI_4$, $ZrF_4$, $ZrCl_2$, $ZrCl_3$, $ZrCl_4$, $ZrBr_3$, $ZrBr_4$, $ZrI_2$, $ZrI_3$, $ZrI_4$, $TcF_6$, $TcF_5$, $TcCl_4$, $TcCl_6$, $TcBr_4$, $ReF_6$, $ReF_4$, $ReF_5$, $ReF_7$, $Re_3Cl_9$, $ReCl_5$, $ReCl_4$, $ReCl_6$, $ReBr_3$, $ReBr_4$, $ReBr_5$, $ReI_3$, $ReI_4$, $CoF_2$, $CoF_3$, $CoF_4$, $CoCl_2$, $CoCl_3$, $CoBr_2$, $CoI_2$, $RhF_3$, $RhF_6$, $RhF_4$, $[RhF_5]_4$, $RhCl_3$, $RhBr_3$, $RhI_3$, $IrF_3$, $IrF_6$, $IrF_4$, $[IrF_5]_4$, $IrCl_2$, $IrCl_3$, $IrCl_4$, $IrBr_2$, $IrBr_3$, $IrBr_4$, $IrI_2$, $IrI_3$, $IrI_4$, $NiF_2$, $NiCl_2$, $NiBr_2$, $NiI_2$, $PdF_2$, $PdF_4$, $PdCl_2$, $PdBr_2$, $PdI_2$, $PtF_6$, $PtF_4$, $[PtF_5]_4$, $PtCl_2$, $PtCl_3$, $PtCl_4$, $Pt_6Cl_{12}$, $PtBr_2$, $PtBr_3$, $PtBr_4$, $PtI_2$, $PtI_3$, $PtI_4$, $GaF_3$, $GaCl_2$, $GaCl_3$, $GaBr_3$, $GaI_3$, $SnF_2$, $SnF_4$, $SnCl_2$, $SnCl_4$, $SnBr_2$, $SnBr_4$, $SnI_2$, and $SnI_4$.

9. The method of claim 1, wherein
the chalcogen precursor includes at least one of sulfur, hydrogen sulfide ($H_2S$), diethyl sulfide, dimethyl disulfide, ethyl methyl sulfide, $(Et_3Si)_2S$, selenium vapor, hydrogen selenide ($H_2Se$), diethyl selenide, dimethyl diselenide, ethyl methyl selenide, $(Et_3Si)_2Se$, selenium vapor, tellurium vapor, hydrogen telluride ($H_2Te$), dimethyl telluride, diethyl telluride, ethyl methyl telluride, and $(Et_3Si)_2Te$.

10. The method of claim 1, wherein
the substrate includes at least one of silicon, silicon oxide, aluminum oxide, magnesium oxide, silicon carbide, silicon nitride, glass, quartz, sapphire, graphite, graphene, polyimide copolymer, polyimide, polyethylene naphthalate (PEN), a fluoropolymer (FEP), and polyethylene terephthalate (PET).

11. The method of claim 1, wherein
the treating the substrate with the metal organic material includes providing the metal organic material around the substrate.

12. The method of claim 11, wherein
the heat-treating the vicinity of the substrate provides the metal on the surface of the substrate by the decomposition of the metal organic material on the substrate.

13. The method of claim 1, wherein
the providing the transition metal precursor and the chalcogen precursor around the substrate forms the transition metal dichalcogenide thin film by an atomic layer deposition (ALD) process or a chemical vapor deposition (CVD) process.

14. The method of claim 1, wherein
the treating the substrate with the metal organic material is performed before the providing the transition metal precursor and the chalcogen precursor around the substrate to synthesize the transition metal dichalcogenide or during the providing the transition metal precursor and the chalcogen precursor around the substrate to synthesize the transition metal dichalcogenide.

15. The method of claim 1, wherein
the transition metal precursor and the chalcogen precursor are provided simultaneously to the substrate or provided alternately to the substrate.

16. A method of forming a transition metal dichalcogenide thin film on a substrate, the method comprising:
treating the substrate with a metal organic material, the metal organic material including a metal; and
synthesizing a transition metal dichalcogenide on the substrate using an atomic layer deposition (ALD) process, wherein
the treating the substrate provides the metal on a surface of the substrate, and
the treating the substrate is performed without using $H_2S$ and includes heat-treating a vicinity of the substrate at a process temperature of 300° C. to 500° C. to decompose the metal organic material.

17. The method of claim 16, wherein
the forming of the transition metal dichalcogenide thin film is performed at 300° C. to 500° C.

18. A method of forming a transition metal dichalcogenide thin film on a substrate, the method comprising:
treating the substrate with a metal organic material, the metal organic material including a metal; and
synthesizing a transition metal dichalcogenide on the substrate using a chemical vapor deposition (CVD) process, wherein
the treating the substrate provides the metal on a surface of the substrate, and
the treating the substrate is performed without using $H_2S$ and includes heat-treating a vicinity of the substrate at a process temperature of 300° C. to 500° C. to decompose the metal organic material.

19. The method of claim 18, wherein
the forming of the transition metal dichalcogenide thin film is performed at 300° C. to 500° C.

* * * * *